(12) United States Patent
Erickson et al.

(10) Patent No.: US 9,059,020 B1
(45) Date of Patent: Jun. 16, 2015

(54) IMPLEMENTING BURIED FET BELOW AND BESIDE FINFET ON BULK SUBSTRATE

(71) Applicant: International Business Machines Corporation, Armonk, NY (US)

(72) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Rochester, MN (US)

(73) Assignee: International Business Machins Corporation, Armonk, NY (US)

( * ) Notice: Subject to any disclaimer, the term of this patent is extended or adjusted under 35 U.S.C. 154(b) by 0 days.

(21) Appl. No.: 14/093,784

(22) Filed: Dec. 2, 2013

(51) Int. Cl.
| | |
|---|---|
| H01L 29/66 | (2006.01) |
| H01L 27/088 | (2006.01) |
| G06F 17/50 | (2006.01) |
| H01L 29/78 | (2006.01) |
| H01L 29/423 | (2006.01) |
| H01L 21/8234 | (2006.01) |
| H01L 21/324 | (2006.01) |
| H01L 21/306 | (2006.01) |
| H01L 21/70 | (2006.01) |

(52) U.S. Cl.
CPC ........ *H01L 27/0886* (2013.01); *G06F 17/5045* (2013.01); *H01L 29/7851* (2013.01); *H01L 29/66803* (2013.01); *H01L 29/4232* (2013.01); *H01L 21/823431* (2013.01); *H01L 21/823418* (2013.01); *H01L 27/088* (2013.01); *H01L 29/66553* (2013.01); *H01L 21/324* (2013.01); *H01L 21/30604* (2013.01)

(58) Field of Classification Search
None
See application file for complete search history.

(56) References Cited

U.S. PATENT DOCUMENTS

| | | | |
|---|---|---|---|
| 7,368,354 B2 | 5/2008 | Anderson et al. | |
| 7,838,913 B2 | 11/2010 | Cheng et al. | |
| 7,915,691 B2 | 3/2011 | Wong et al. | |
| 8,269,271 B2 | 9/2012 | Iwamoto et al. | |
| 8,530,972 B2 | 9/2013 | John et al. | |
| 2004/0266076 A1 | 12/2004 | Doris et al. | |
| 2005/0189583 A1* | 9/2005 | Kim et al. | 257/327 |
| 2009/0184369 A1 | 7/2009 | Zhu | |
| 2009/0289304 A1 | 11/2009 | Pouydebasque et al. | |
| 2009/0294800 A1 | 12/2009 | Cheng et al. | |
| 2009/0321835 A1* | 12/2009 | Wirbeleit | 257/365 |
| 2011/0291196 A1* | 12/2011 | Wei et al. | 257/365 |
| 2012/0161238 A1 | 6/2012 | Scheiper et al. | |
| 2013/0207194 A1* | 8/2013 | Cai et al. | 257/368 |
| 2013/0264630 A1* | 10/2013 | Kim et al. | 257/321 |

OTHER PUBLICATIONS

Definition of beside. (n.d.) Collins English Dictionary—Complete and Unabridged. (1991, 1994, 1998, 2000, 2003). Retrieved Oct. 29, 2014 from http://www.thefreedictionary.com/beside.*

* cited by examiner

*Primary Examiner* — Michael Jung
(74) *Attorney, Agent, or Firm* — Joan Pennington

(57) ABSTRACT

A method and circuit for implementing an enhanced transistor topology enabling enhanced current capability with added device drive strength with buried field effect transistors (FETs) below and beside a traditional FinFET on a bulk substrate, and a design structure on which the subject circuit resides are provided. Buried field effect transistors (FETs) are formed on either side and under the traditional FinFET. The gate of the FinFET becomes the gate of the parallel buried (FETs) and allows self alignment to the underlying sources and drains of the buried FET devices in the bulk semiconductor.

4 Claims, 7 Drawing Sheets

400
ANISOTROPICALLY ETCH TO REMOVE SPACER FROM HORIZONTAL SURFACES LEAVING SIDEWALL SPACER

PRIOR ART

<u>100</u>

CONVENTIONAL FINFET FORMED ON BULK SUBSTRATE

```
┌─────────────────────────────────────────────────────────────┐
│  FORM A FINFET ON BULK SUBSTRATE WITHOUT DOGBONE SHAPED SOURCE │
│                        AND DRAIN                               │
│                          600                                   │
└─────────────────────────────────────────────────────────────┘
                              │
┌─────────────────────────────────────────────────────────────┐
│      DEPOSIT BLANKET SPACER OVER FINFET AND BULK SUBSTRATE    │
│                          602                                   │
└─────────────────────────────────────────────────────────────┘
                              │
┌─────────────────────────────────────────────────────────────┐
│  COMPLETE ~45 DEG AND ~135 DEG ANGLED SOURCE AND DRAIN IMPLANTS │
│  THROUGH SPACER FILM AND INTO SOURCE AND DRAIN REGIONS. ACTIVATING │
│   EACH IMPLANTED REAGIONS BY ONE OR MORE ANNEALS OF THE FINFET. │
│                          604                                   │
└─────────────────────────────────────────────────────────────┘
                              │
┌─────────────────────────────────────────────────────────────┐
│  ANISOTROPICALLY ETCH TO REMOVE SPACER FROM HORIZONTAL SURFACES, │
│                  LEAVING SIDEWALL SPACERS.                     │
│                          606                                   │
└─────────────────────────────────────────────────────────────┘
                              │
┌─────────────────────────────────────────────────────────────┐
│   CONSTRUCT BAR CONTACT TO THE COMMON DRAINS AND ANOTHER BAR   │
│              CONTACT TO THE COMMON SOURCES.                    │
│                          608                                   │
└─────────────────────────────────────────────────────────────┘
```

IMPLEMENTING BURIED FET BELOW AND BESIDE FINFET ON BULK SUBSTRATE

FIELD OF THE INVENTION

The present invention relates generally to the data processing field, and more particularly, relates to a method and circuit for implementing an enhanced transistor topology enabling enhanced current capability with added device drive strength with a buried field effect transistor (FET) below and beside traditional FinFETs on a bulk substrate, and a design structure on which the subject circuit resides.

DESCRIPTION OF THE RELATED ART

Fin-type field effect transistors (FinFETs) are high speed devices that can be densely packed on a substrate. FinFETs offer relatively high current density transistors but limitations still drive designs to utilize a large number of FinFET fingers to drive large capacitance loads both on die and particularly off die.

A need exists for a method and circuit for implementing an enhanced transistor topology enabling added device drive strength with a buried field effect transistor (FET) below and beside traditional FinFETs on a bulk substrate, for example, increasing current densities per fin and per unit area of transistor.

SUMMARY OF THE INVENTION

Principal aspects of the present invention are to provide a method and circuit for implementing an enhanced transistor topology enabling enhanced current capability with buried field effect transistors (FETs) below and beside traditional FinFETs on a bulk substrate, and a design structure on which the subject circuit resides. Other important aspects of the present invention are to provide such method, circuit and design structure substantially without negative effect and that overcome many of the disadvantages of prior art arrangements.

In brief, a method and circuit for implementing an enhanced transistor topology enabling enhanced current capability with buried field effect transistors (FETs) below and beside a traditional FinFET on a bulk substrate, and a design structure on which the subject circuit resides are provided. Buried field effect transistors (FETs) are formed on either side and under the traditional FinFET. The gate of the FinFET becomes the gate of the parallel buried (FETs) and allows self alignment to the underlying sources and drains of the buried FET devices in the bulk semiconductor.

In accordance with features of the invention, a traditional semiconductor FinFET is formed via traditional FinFET processing and includes forming the FinFET gate, gate dielectric and depositing a blanket spacer film via traditional FinFET processing. The traditional source and drain implants are utilized to dope not only the FinFET sources and drains but also the new buried transistor sources and drains (S/D) diffusions. These areas exist on either side of the FinFET gate material that exists on the sides of the semiconductor fin. The implanted regions are activated via the same anneal or anneals as the base FinFET.

In accordance with features of the invention, process flow is substantially the same as an existing FinFET process flow with only predefined layout shape changes.

BRIEF DESCRIPTION OF THE DRAWINGS

The present invention together with the above and other objects and advantages may best be understood from the following detailed description of the preferred embodiments of the invention illustrated in the drawings, wherein:

FIG. 6 is a flow chart illustrating example process steps for implementing an enhanced transistor topology enabling added device drive strength with buried field effect transistors (FETs) formed below and beside traditional FinFETs on a bulk substrate in accordance with the preferred embodiment.

DETAILED DESCRIPTION OF THE PREFERRED EMBODIMENTS

In accordance with features of the invention, a method and circuit for implementing an enhanced transistor topology enabling enhanced current capability with buried field effect transistors (FETs) below and beside traditional FinFETs on a bulk substrate are provided.

In accordance with features of the invention, process flow is substantially identical to the existing FinFET process flow with only selected layout shape changes. The present invention allows fabrication of buried field effect transistor (FETs) below and beside a FinFET with no traditional landing areas required to fully land the contacts to the FinFET source and drain as the new buried diffusions on either side advantageously are part of the landing area.

Having reference now to the drawings, in FIGS. 1-5, there are shown example structures and processing steps for implementing an enhanced transistor topology enabling added device drive strength with buried field effect transistors (FETs) formed below and beside traditional FinFETs on a bulk substrate in accordance with the preferred embodiment.

Figure 1:
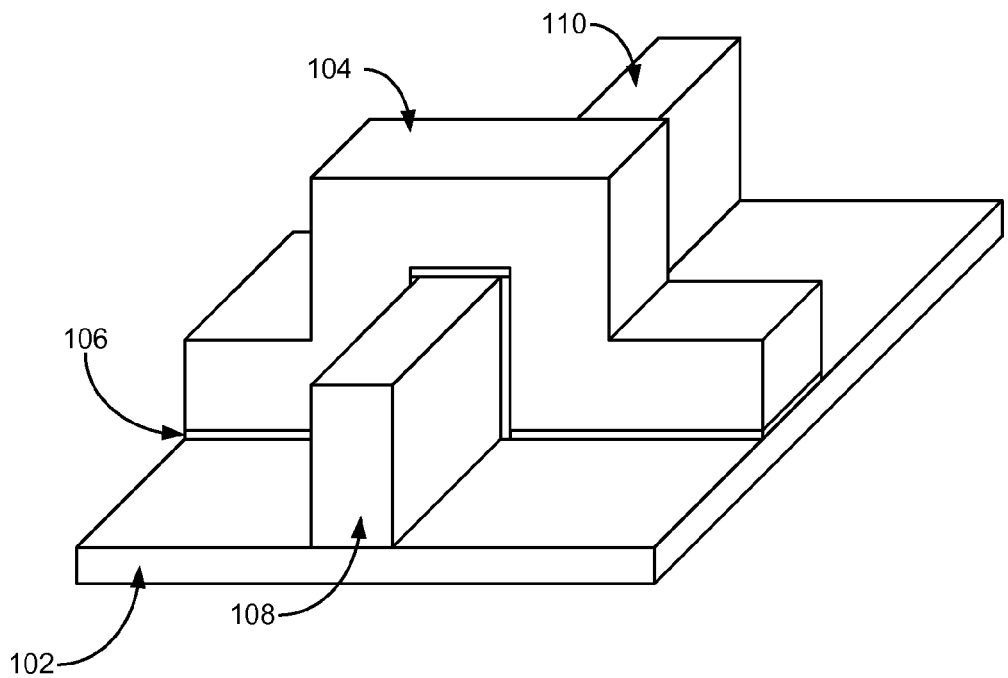
FIGS. 1, 2, 3, 4, and 5 illustrate example structures and process steps for implementing an enhanced transistor topology enabling enhanced current capability with buried field effect transistors (FETs) formed below and beside traditional FinFETs on a bulk substrate in accordance with the preferred embodiment.

In FIG. 1, there is shown a processing step with a formed FinFET generally designated by the reference character 100. The FinFET 100 is formed using traditional FinFET fabrication technique on a semiconductor substrate 102. The FinFET 100 includes a gate region 104 formed on a gate dielectric 106, a drain region 108, and a source region 110. FinFET 100 includes the drain region 108 and the source region 110 that are formed without a dog-bone shaped source and drain. For example, for an N type FinFET, the semiconductor substrate 102 is a P— silicon substrate; or alternatively for a P type FinFET, an N—Si substrate could be used.

Figure 2:
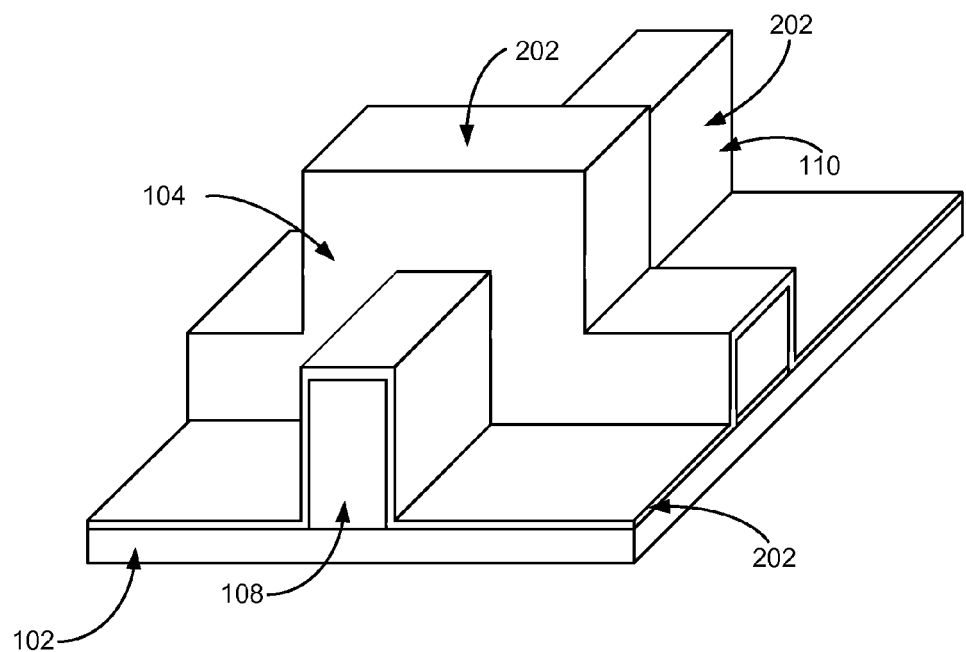

In FIG. 2, a next processing step generally designated by the reference character 200 provides a blanket spacer 202. The blanket spacer, such as $SiO_2$ spacer film, is applied or deposited over the FinFET 100 and substrate 102.

Figure 3:
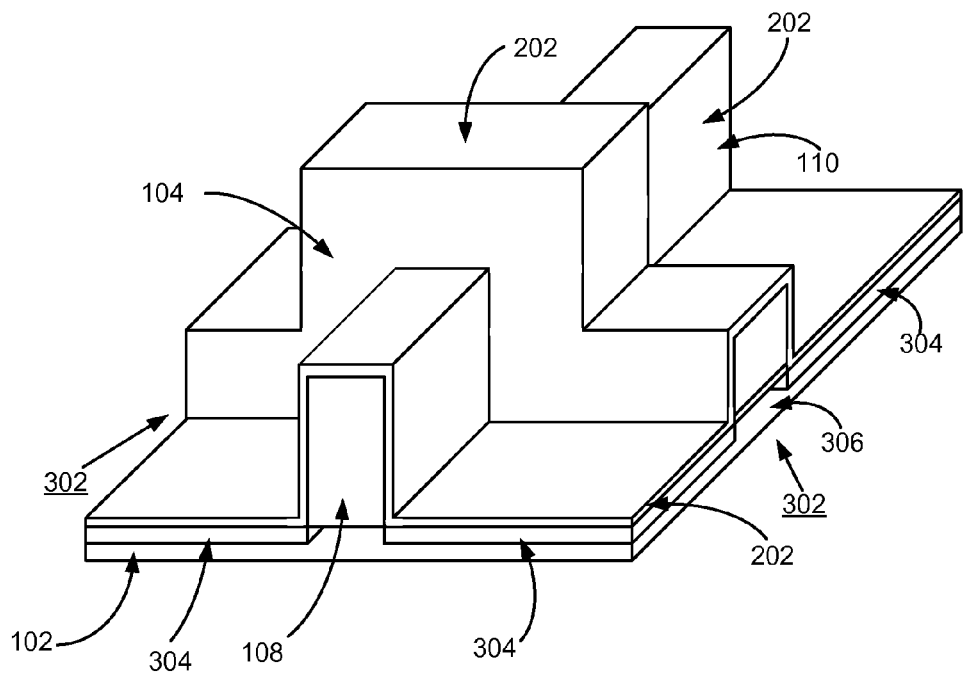

Referring to FIG. 3, there are shown next doping processing steps generally designated by the reference character 300 to form first and second buried FETs generally designated by the reference character 302. The first and second buried FETs 302 are formed in the substrate 102, with the left and right extensions of the FinFET gate 104 acting as the gate 306 of the planar buried FETs. Angled S/D implants, such as ~45 deg and ~135 deg angled source/drain implants are provided through the spacer 202 into the source and drain regions 304. The angled S/D implants are utilized to dope the FinFET source and drain and the new buried field effect transistor S/D diffusions 304. These S/D diffusion areas 304 exist on either side of the FinFET drain 108 and source 110 regions and form two planar buried FETs in parallel with the FinFET. The implanted S/D diffusion regions 304 are activated via the same anneals as the base FinFET device that utilize a conventional or traditional process. Subsequent contacting to the gate of all three parallel transistors is made via traditional means.

Figure 4:
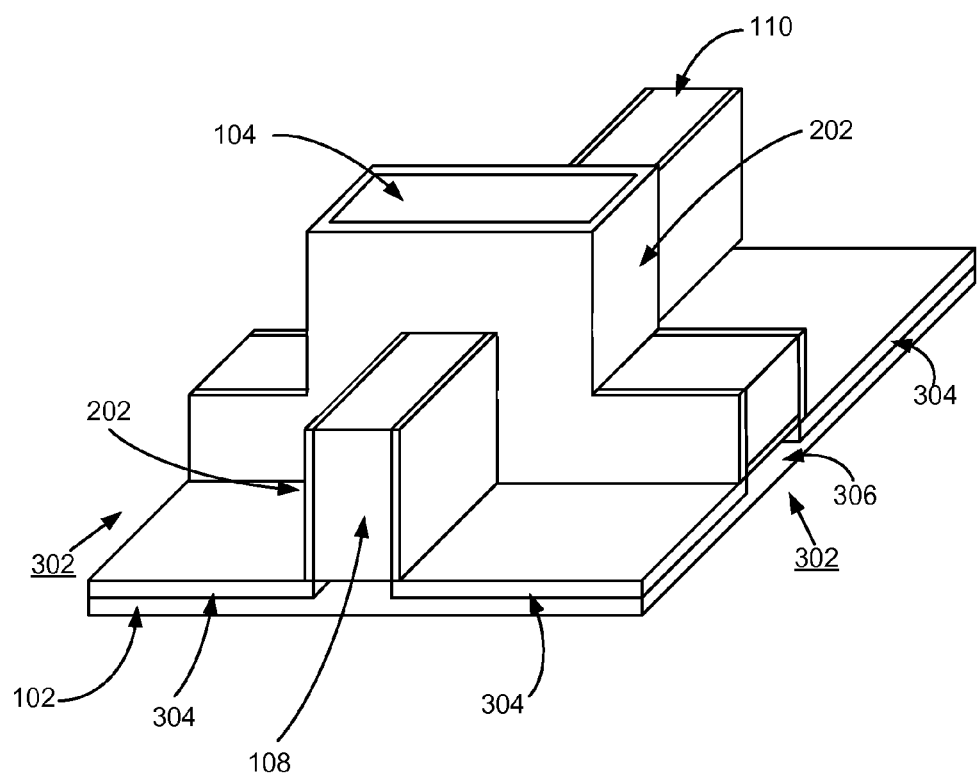

Referring to FIG. 4, there is shown next step generally designated by the reference character 400 that includes anisotropically etching to remove the spacer from all horizontal surfaces of the FinFET 100 and substrate 102 leaving only sidewall spacer 202.

In accordance with features of the invention, the source and drain contacts are one of the greatest advantages of this invention. No traditional landing areas are required to fully land the contacts to the FinFET source and drain as the new buried diffusion on either side advantageously are part of the landing area.

Figure 5:
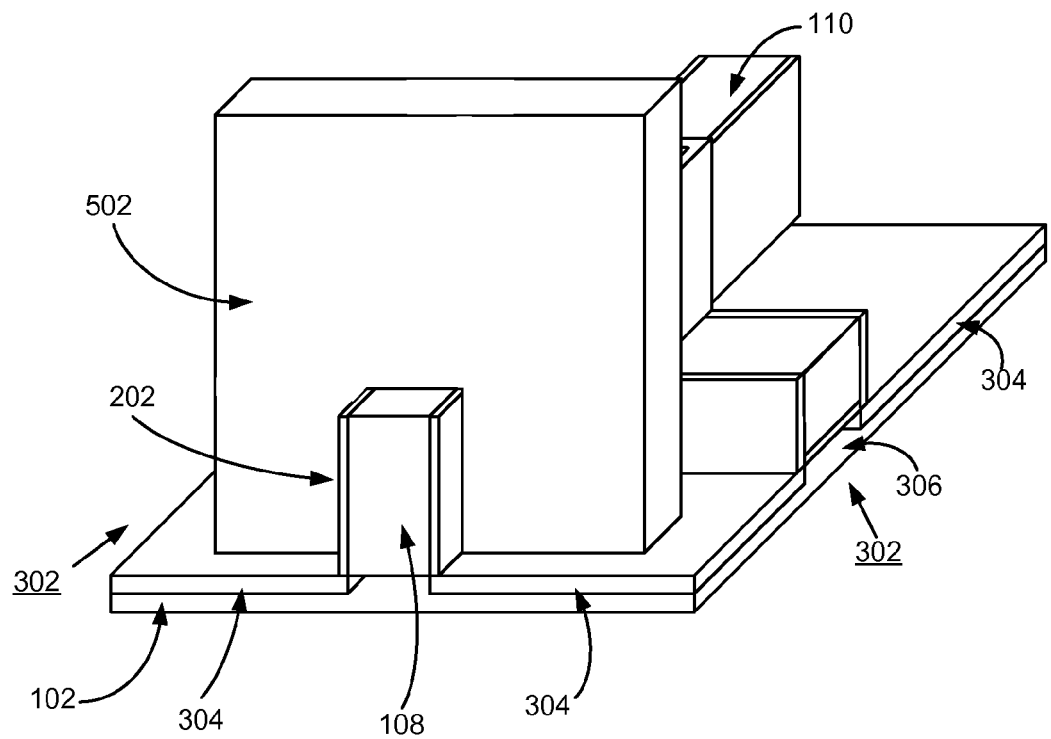

Referring to FIG. 5, there is shown next steps providing circuit structure generally designated by the reference character 500 that include constructing a respective bar contact that crosses the fin and contacts all three drains, and another all three sources is constructed. A bar contact 502 to the common drains and another bar contact (not shown in FIG. 5) that crosses the fin and contacts all three common sources is constructed. Circuit structure 500 nominally requires less total transistor area than a traditional FinFET area and adds significantly to the total transistor current.

Referring now to FIG. 6, there are shown example process steps for implementing the enhanced transistor topology enabling enhanced current capability via added device drive strength with buried field effect transistors (FETs) formed below and beside traditional FinFETs on a bulk substrate in accordance with the preferred embodiments.

As indicated in a block 600, a FinFET is formed using traditional fabrication technique on a bulk substrate without a dog-bone shaped source and drain. As indicated in a block 602, a blanket spacer is applied to the sidewall and horizontal surfaces of the FinFET and the bulk substrate.

As indicated in a block 604, ~45 deg and ~135 deg angled source and drain implants are completed through the blanket spacer and into the source and drain regions of buried FETs that are formed on either side and under the FinFET where the gate of the FinFET becomes the gate of each of the buried FETs and allows self alignment to the underlying sources and drains of the buried FETs in the bulk semiconductor. The implanted regions are activated via the same anneal or anneals as the base FinFET.

As indicated in a block 606, anisotropically etching is provided to remove the blanket spacer from the horizontal surfaces of the FinFET and the bulk substrate.

As indicated in a block 608, a first bar contact to all three drains is constructed, and another bar contact to all three sources is constructed. The FinFET and first and second buried FETs are connected in parallel, having the common source connection and the common drain connection. The parallel-connected FinFET with first and second buried FETs enable enhanced current capability, and no traditional landing areas are required to fully land the contacts to the FinFET source and drain as the new buried diffusion on either side advantageously are part of the landing area with the enhanced transistor topology of the invention.

Figure 7:
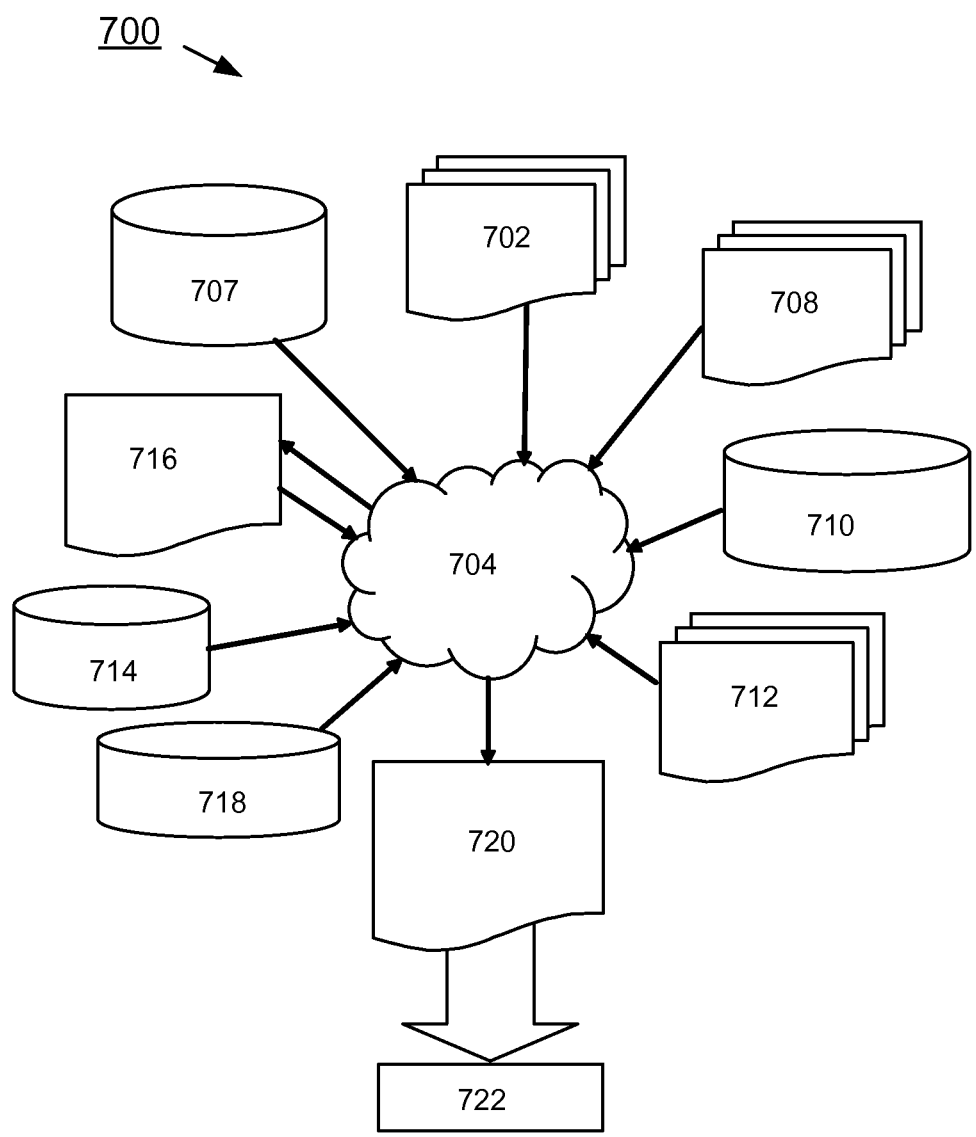
FIG. 7 is a flow diagram of a design process used in semiconductor design, manufacturing, and/or test.

FIG. 7 shows a block diagram of an example design flow 700 that may be used for high speed serial link circuit and the interconnect chip described herein. Design flow 700 may vary depending on the type of IC being designed. For example, a design flow 700 for building an application specific IC (ASIC) may differ from a design flow 700 for designing a standard component. Design structure 702 is preferably an input to a design process 704 and may come from an IP provider, a core developer, or other design company or may be generated by the operator of the design flow, or from other sources. Design structure 702 comprises circuit structure 400 in the form of schematics or Hardware Description Language (HDL), a hardware-description language, for example, Verilog, VHSIC Hardware Description Language (VHDL) where VHSIC is Very High Speed Integrated Circuit, C, and the like. Design structure 702 may be contained on one or more machine readable medium. For example, design structure 702 may be a text file or a graphical representation of circuit structure 500. Design process 704 preferably synthesizes, or translates, circuit structure 500 into a netlist 706, where netlist 706 is, for example, a list of wires, transistors, logic gates, control circuits, I/O, models, etc. that describes the connections to other elements and circuits in an integrated circuit design and recorded on at least one of machine readable medium. This may be an iterative process in which netlist 706 is resynthesized one or more times depending on design specifications and parameters for the circuits.

Design process 704 may include using a variety of inputs; for example, inputs from library elements 708 which may house a set of commonly used elements, circuits, and devices, including models, layouts, and symbolic representations, for a given manufacturing technology, such as different technology nodes, 22 nm, 14 nm, and smaller, design specifications 710, characterization data 712, verification data 714, design rules 716, and test data files 718, which may include test patterns and other testing information. Design process 704 may further include, for example, standard circuit design processes such as timing analysis, verification, design rule checking, place and route operations, and the like. One of ordinary skill in the art of integrated circuit design can appreciate the extent of possible electronic design automation tools and applications used in design process 704 without deviating from the scope and spirit of the invention. The design structure of the invention is not limited to any specific design flow.

Design process 704 preferably translates embodiments of the invention as shown in FIGS. 1-5, and 6 along with any additional integrated circuit design or data (if applicable), into a second design structure 720. Design structure 720 resides on a storage medium in a data format used for the exchange of layout data of integrated circuits, for example, information stored in a Graphic Data System (GDS) or GDSII (GDS2), Global Level-1 (GL1), Open Artwork System Interchange Standard_(OASIS), or any other suitable format for storing such design structures. Design structure 720 may comprise information such as, for example, test data files, design content files, manufacturing data, layout parameters, wires, levels of metal, vias, shapes, data for routing through the manufacturing line, and any other data required by a semiconductor manufacturer to produce embodiments of the invention as shown in FIGS. 1-5, and 6. Design structure 720 may then proceed to a stage 722 where, for example, design structure 720 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing an enhanced transistor topology enabling enhanced current capability comprising:
a fin field effect transistor (FinFET); said FinFET formed on a semiconductor substrate; said FinFET having in-line source and drain regions formed without a dog-bone shape and a gate region formed on a gate dielectric with first and second gate extensions extending past opposing sides of said in-line source and drain regions;

a first field effect transistor (FET) formed in said semiconductor substrate beside and under said FinFET and a second FET formed in said semiconductor substrate beside and under said FinFET; each of said first FET and said second FET having buried source and drain diffusions formed in said semiconductor substrate on the opposing sides of said in-line source and drain regions with angled implants used to dope said buried source and drain diffusions and FinFET; and said first and second gate extensions of said FinFET providing a gate of said first FET and said second FET.

2. The circuit as recited in claim 1 wherein said Fin FET, said first FET and said second FET are connected in parallel, having a common source connection and a common drain connection.

3. The circuit as recited in claim 2 wherein each of said common source connection and said common drain connection include a bar contact.

4. The circuit as recited in claim 1 wherein said semiconductor substrate includes a bulk substrate.

* * * * *